United States Patent

Onishi et al.

[11] 4,236,253
[45] Nov. 25, 1980

[54] MONOSTABLE MULTIVIBRATOR FOR USE IN PULSE COUNT DEMODULATOR OR THE LIKE

[75] Inventors: Masaru Onishi; Yukihiko Miyamoto, both of Tokyo, Japan

[73] Assignee: Trio Kabushiki Kaisha, Tokyo, Japan

[21] Appl. No.: 74,680

[22] Filed: Sep. 12, 1979

[30] Foreign Application Priority Data

Sep. 18, 1978 [JP] Japan ................................ 53-114281

[51] Int. Cl.³ .......................... H04B 1/16; H03D 3/04; H03K 3/284
[52] U.S. Cl. .................................... 455/214; 307/273; 329/128
[58] Field of Search ................ 455/214, 337; 307/273, 307/265, 233 R; 329/126, 128

[56] References Cited
U.S. PATENT DOCUMENTS

| | | | |
|---|---|---|---|
| 2,720,584 | 10/1955 | Sloughter | 329/128 |
| 3,025,417 | 3/1962 | Campbell, Jr. | 307/273 |
| 3,389,273 | 6/1968 | Haines | 307/273 |
| 3,419,735 | 12/1968 | Seer, Jr. et al. | 307/273 |
| 3,473,133 | 10/1969 | Hummel | 455/214 |
| 3,569,744 | 3/1971 | Garrahan | 307/273 |

Primary Examiner—Marc E. Bookbinder
Attorney, Agent, or Firm—Gerald J. Ferguson, Jr.; Joseph J. Baker

[57] ABSTRACT

In a monostable multivibrator including a gate circuit having at least two inputs where an input signal is applied to a first one of the two inputs and a feedback signal to the other input, a differentiator circuit responsive to the output from the gate circuit, a differential inverter including a current switching circuit where an output load is connected to the collector of the output transistor for deriving an output signal, the improvement comprising an AC grounded base transistor connected in series between the collector of the second transistor and the output load.

Even when a low-pass filter is connected to the output load of the above multivibrator, the output signal thereof is stabilized which is important when the multivibrator is used in combination with a low-pass filter in an FM receiver pulse count demodulating circuit.

6 Claims, 4 Drawing Figures

MONOSTABLE MULTIVIBRATOR FOR USE IN PULSE COUNT DEMODULATOR OR THE LIKE

BACKGROUND OF THE INVENTION

This invention relates to an improvement of monostable multivibrators. More specifically, it relates to a monostable multivibrator that stabilizes the output pulse width when a low-pass filter is connected to the output as in the case of using it in a pulse count system FM demodulator.

As shown in FIG. 1, a conventional monostable multivibrator may comprise a gate circuit 1 such as a NAND gate, a differentiator time constant circuit 4 including a capacitor 2 and a resistor 3, and a differential inverter comprising a current switching circuit where the common emitters of transistors 5 and 6 are connected to a constant current source 7. The collector of transistor 5 is grounded through a load resistor 8 while the collector of transistor 6 is connected to the −B power supply through a load resistor 9. The base of transistor 5 has applied thereto the output of differentiator circuit 4 while the base of transistor 6 has applied thereto the +B power supply as divided by resistors 10 and 11. An output is obtained from the collector of transistor 6 by applying a trigger pulse to one of the input terminals of gate circuit 1, the collector output of transistor 5 being applied to the other input terminal of the gate circuit.

Regarding the differential inverter circuit, changes in the ambient temperature with respect to the respective emitter-base voltages, $V_{BE}$, of transistors 5 and 6 identically affect both transistors. Also the current of transistor 6 is regulated by constant current source 7 so that the carrier accumulation time is shortened. Thus, carrier accumulation time fluctuations with respect to changes in the ambient temperature can be virtually ignored. Hence, fluctuations in the output pulse width caused by changes in the ambient temperature of this monostable multivibrator are reduced.

On the other hand, as is well-known, a pulse count system demodulator applies the intermediate frequency signal of an FM receiver to a limiter amplifier so that square waves are formed by the limiter amplifier. The output of the limiter amplifier is applied to a differentiator circuit to obtain trigger pulses with narrow pulse width which are synchronized with the rise and fall of the square waves. The output of the differential circuit triggers a monostable multivibrator to obtain output pulses of constant width. The monostable multivibrator output is then applied to a low-pass filter—that is, an integrator which equalizes the output of the monostable multivibrator, to thereby demodulate the intermediate frequency signal to obtain the audio output.

If a low-pass filter is connected to the output terminal OUT of FIG. 1 as in the case of a pulse count system demodulator, the differential inverter and the low-pass filter are as shown in FIG. 2 where 12 is the low-pass filter. When the output frequency of differentiator circuit 4 is high and low-pass filter 12 is not connected, the output of the monostable multivibrator—that is, the collector output waves of transistor 6, is a square wave shown in FIG. 3(a). However, when low-pass filter 12 is connected, the collector output waveform of transistor 6 becomes triangular as also shown in FIG. 3(a). The collector average is $V_{C1}$ as shown by the phantom line in FIG. 3(a).

Further, when the output frequency of differentiator circuit 4 is low and low-pass filter 12 is not connected, the collector output waveform of transistor 6 is a square wave as shown in FIG. 3(b). When the low-pass filter 12 is connected, the collector output waveform of transistor 6 becomes triangular as shown in FIG. 3(b), the mean voltage being $V_{C2}$ as shown by the phantom line in FIG. 3(b). In other words, the average collector voltage $V_C$ of transistor 6 fluctuates with the output frequency of differential circuit 4.

Generally, when an inverse voltage $V_{BC}$ is impressed on the collector-base of a transistor, the collector-base capacitance $C_{BC}$ changes with the inverse voltage. Therefore, when (a) low-pass filter 12 is connected to the output terminal as shown in FIG. 2, and (b) the base voltage $V_B$ of transistor 6 is constant, and (c) the average collector voltage $V_C$ of transistor 6 fluctuates with the output frequency of the differentiator circuit 4 as described above, the collector-base inverse voltage $V_{BC}$ of the transistor 6 fluctuates so that the collector-base capacitance $C_{BC}$ changes. Thus, the FIG. 2 arrangement has shortcomings in that the amount of negative feedback of the differential inverter circuit changes, the gain changes, and the output pulse width of the monostable multivibrator fluctuates. Further, when this monostable multivibrator is used in a pulse count system demodulator, the fluctuation of the output pulse width appears as distortion when the FM signals are demodulated. If a low-pass filter that increases the load capacitance sufficiently with respect to $C_{BC}$ is used in order to eliminate these problems, the changes in $C_{BC}$ can be ignored and the changes in the amount of negative feedback can also be ignored, thus eliminating the above problems. However, this has the shortcoming of narrowing the reproduction zone of the demodulator.

SUMMARY OF THE INVENTION

Thus, the object of this invention is to provide a monostable multivibrator which does not have the above shortcomings.

Other objects and advantages of this invention will be apparent from a reading of the following specification and claims taken with the drawing.

DETAILED DESCRIPTION OF PREFERRED EMBODIMENT OF THE INVENTION

Figure 3:
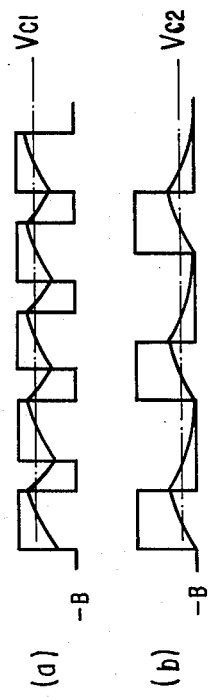
FIGS. 3(a) and 3(b) are waveforms which illustrate the operation of the monostable multivibrator of FIG. 1.

Reference should be made to the drawing where like reference numerals refer to like parts.

Figure 4:
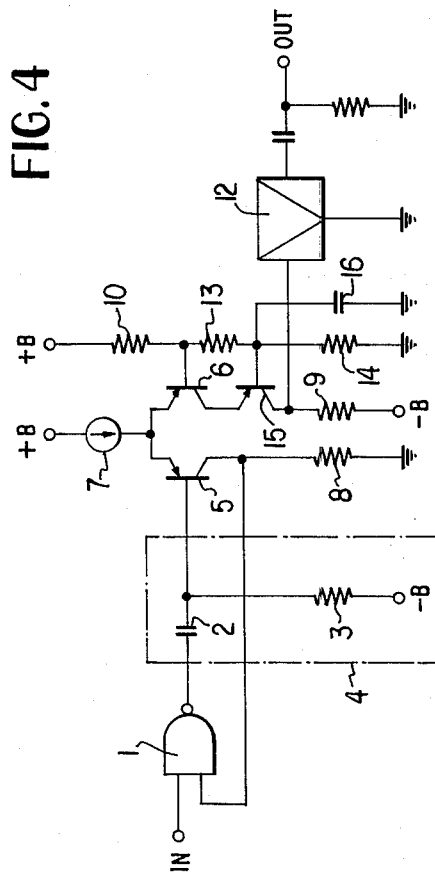
FIG. 4 is a circuit diagram of a monostable multivibrator in accordance with an illustrative embodiment of the invention.

FIG. 4 is a circuit diagram of a monostable multivibrator in accordance with an illlustrative embodiment of this invention where a low-pass filter is connected as a load. The monostable multivibrator of this embodiment comprises gate circuit 1, differentiator constant circuit 4 including capacitor 2 and resistor 3, and a differential inverter whose current switching circuit includes transistors 5 and 6, constant current source 7, collector load resistors 8 and 9, voltage dividing resistors 10, 13 and 14, and a grounded base transistor 15 connected in series between the collector of transistor 6 and collector load resistor 9 so that the voltage divided by resistors 13 and 14 is applied to the base of transistor 15. An output is obtained from the collector of transistor 15 by applying an input trigger pulse to the first input terminal of gate circuit 1. Further, the collector output of transistor 5 is applied to the second input terminal of the gate circuit. 16 is a by-pass capacitor for resistor 14 and AC-grounds the base of transistor 15. 12 is a low-pass filter load for the monostable multivibrator.

Figure 1:
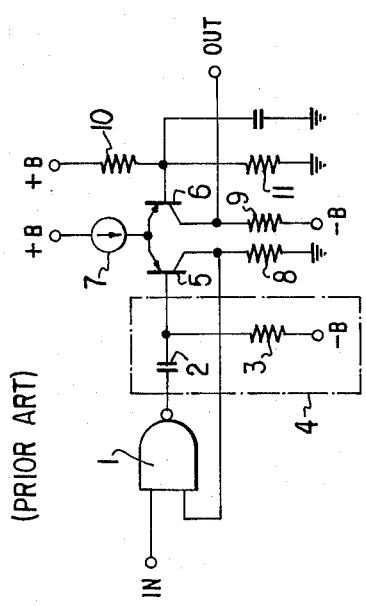
FIG. 1 is a circuit diagram of a conventional monostable multivibrator.
Figure 2:
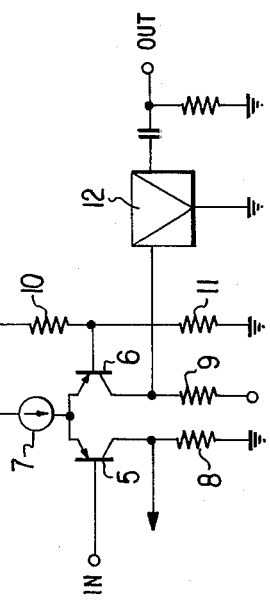
FIG. 2 is a circuit diagram showing the differential inverter of the monostable multivibrator of FIG. 1 with a low-pass filter as a load.

The above monostable multivibrator operates the same as the monostable multivibrator shown in FIG. 1. However, grounded base transistor 15 is connected to the collector of transistor 6 and the voltage divided by the resistors 13 and 14 is applied to the base of transistor 15. Consequently, the base-emitter voltage of transistor 15 is almost constant, and regardless of the presence or absence of low-pass load filter 12 and the output frequency of differentiator circuit 4 the collector-base inverse voltage, $V_{BC}$, of transistor 6 is also almost constant at all times. Thus, the collector-base capacitance $C_{BC}$ transistor 6 is also constant and does not fluctuate. Consequently, the output pulse width of the monostable multivibrator does not fluctuate so that an output pulse with stable pulse width can be obtained.

As described above, when this invention is employed, a monostable multivibrator is provided that generates an output pulse with stable pulse width at all times regardless of the kind of low-pass filter connected to the monostable multivibrator as a load. Therefore, when the monostable multivibrator of this invention is used in a pulse count system demodulator, the output pulse width of the monostable multivibrator does not fluctuate due to changes in the carrier frequency. Further, the cut-off frequency of the integrator of the pulse count system demodulator can be increased thus widening the demodulation band. Furthermore, little, if any, distortion is produced.

It is to be understood that the above detailed description of an embodiment of the invention is provided by way of example only. Various details of design and construction may be modified without departing from the true spirit and scope of the invention as set forth in the appended claims.

What is claimed is:

1. In a monostable multivibrator including a gate circuit having at least two inputs where an input signal is applied to a first one of the two inputs and a feedback signal to the other input, a differentiator circuit responsive to the output from the gate circuit, a differential inverter responsive to said differentiator circuit, supplying said feedback signal and including a current switching circuit having a pair of transistors where an output load is connected to the collector of one of said transistors for deriving an output signal, the improvement comprising an AC grounded base transistor connected in series between the collector of said one transistor and said output load.

2. The improvement as in claim 1 including a low-pass filter connected between said grounded base transistor and the output load.

3. The improvement as in claim 2 including an FM receiver having at least one intermediate frequency amplifier, a limiter responsive to the intermediate frequency amplifier output for forming square waves, a differentiator circuit responsive to the square waves for forming trigger pulses synchronized with the rise or fall of the square waves, said trigger pulses being applied to said first input of the said gate circuit, the output of the low-pass filter being the demodulated output of the FM receiver.

4. In a monostable multivibrator including a gate circuit having at least two inputs where an input signal is applied to a first one of the two inputs, a differentiator circuit responsive to the output from said gate circuit, a differential inverter including a pair of transistors whose emitters are connected in common to a constant current source the base of the first of said transistor pair being responsive to the output from the differential circuit, a load connected to the collector of said first transistor for deriving a feedback signal applied to the other input of said gate circuit and an output load connected to the collector of said second transistor for deriving an output signal, the improvement comprising an AC grounded base transistor connected in series between the collector of the second transistor and said output load.

5. The improvement as in claim 4 including a low-pass filter connected between said grounded base transistor and the output load.

6. The improvement as in claim 5 including an FM receiver having at least one intermediate frequency amplifier, a limiter responsive to the intermediate frequency amplifier output for forming square waves, a differentiator circuit responsive to the square waves for forming trigger pulses synchronized with the rise or fall of the square waves, said trigger pulses being applied to said first input of the said gate circuit, the output of the low-pass filter being the demodulated output of the FM receiver.

* * * * *